US 6,631,089 B1

(12) United States Patent
Ogura et al.

(10) Patent No.: US 6,631,089 B1
(45) Date of Patent: Oct. 7, 2003

(54) BIT LINE DECODING SCHEME AND CIRCUIT FOR DUAL BIT MEMORY ARRAY

(75) Inventors: Nori Ogura, Hopewell Jct., NY (US); Tomoko Ogura, Hopewell Jct., NY (US)

(73) Assignee: Halo LSI, Inc., Wappingers Falls, NY (US)

(*) Notice: Subject to any disclaimer, the term of this patent is extended or adjusted under 35 U.S.C. 154(b) by 0 days.

(21) Appl. No.: 10/190,636

(22) Filed: Jul. 8, 2002

Related U.S. Application Data

(60) Provisional application No. 60/303,712, filed on Jul. 6, 2001.

(51) Int. Cl.[7] .............................................. G11C 16/06
(52) U.S. Cl. ........................... 365/185.23; 365/185.03; 365/185.11; 365/230.04
(58) Field of Search ....................... 365/185.23, 185.11, 365/230.04, 230.06, 185.33, 185.03

(56) References Cited

U.S. PATENT DOCUMENTS

| 5,953,250 A | * | 9/1999 | Hsu et al. ............... 365/185.11 |
| 6,011,725 A | | 1/2000 | Eitan ..................... 365/185.33 |
| 6,248,633 B1 | | 6/2001 | Ogura et al. ................ 438/267 |
| 6,459,622 B1 | | 10/2002 | Ogura et al. ........... 365/185.28 |
| 6,469,935 B2 | | 10/2002 | Hayashi ................. 365/185.18 |

* cited by examiner

Primary Examiner—David Lam
(74) Attorney, Agent, or Firm—George O. Saile; Stephen B. Ackerman

(57) ABSTRACT

In the present invention a bit line decoder circuit a method of selecting bit lines for read and program operations is described for a twin MONOS memory cell array. A block of twin MONOS memory cells is partitioned into sub-blocks wherein decode signals select bit lines to be read and programmed, and select adjacent bit lines to provide bias for the read and program operations. The bit lines are partitioned into even and odd addresses within each sub-block, and an even and odd address sub-block selector connects the selected bit line along with adjacent bit lines to sense amplifiers and memory chip I/O.

35 Claims, 7 Drawing Sheets

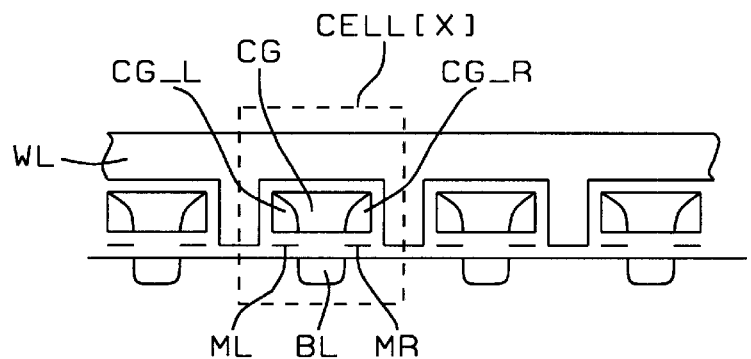
*FIG. 1 - Prior Art*
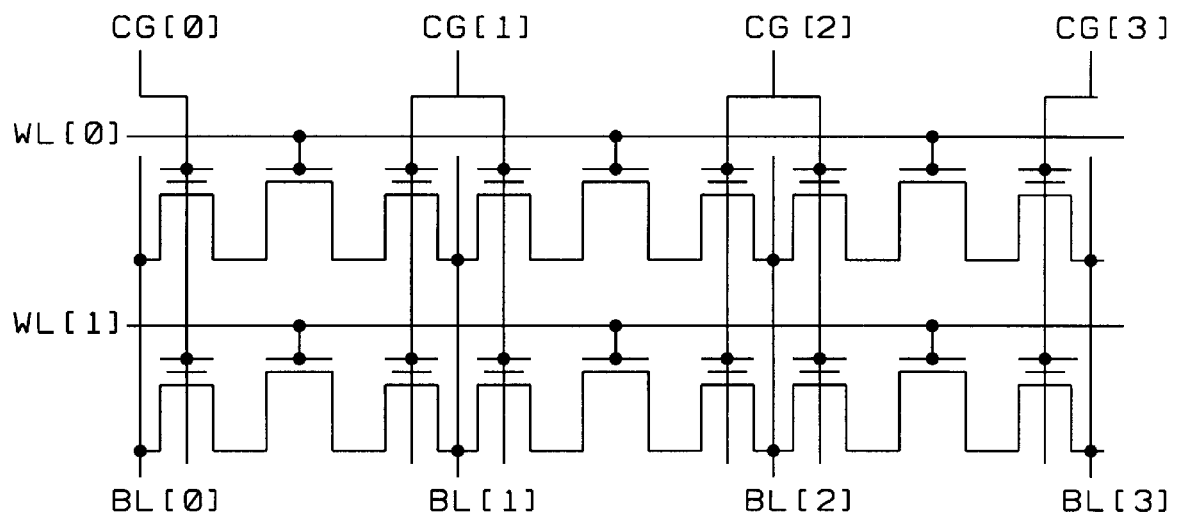
*FIG. 2 - Prior Art*

| Physical Address | | | Read | | | |
| --- | --- | --- | --- | --- | --- | --- |
| CELL | L/R | B | YDA | YDB_EV | YDB_OD | YD_EV/OD |
| 0 | L | 00 | DL,0,1 | 0 | 0 | EV |
| 0 | R | 00 | DL,0,1 | 0 | 0 | EV |
| 1 | L | 01 | 0,1,2 | 0 | 0 | OD |
| 1 | R | 01 | 0,1,2 | 0 | 0 | OD |
| 2 | L | 02 | 1,2,3 | 0 | 0 | EV |
| 2 | R | 02 | 1,2,3 | 0 | 0 | EV |
| J-1 | L | J-1 | K-2,K-1,0 | 0,1 | 0 | OD |
| J-1 | R | J-1 | K-2,K-1,0 | 0,1 | 0 | OD |
| Z-J | L | Z-J | K-1,0,1 | J-1 | J-1,J-2 | EV |
| Z-J | R | Z-J | K-1,0,1 | J-1 | J-1,J-2 | EV |
| Z-2 | L | Z-2 | K-3,K-2,K-1 | J-1 | J-1 | EV |
| Z-2 | R | Z-2 | K-3,K-2,K-1 | J-1 | J-1 | EV |
| Z-1 | L | Z-1 | K-2,K-1,DR | J-1 | J-1 | OD |
| Z-1 | R | Z-1 | K-2,K-1,DR | J-1 | J-1 | OD |

*FIG. 5A*

| Physical Address | | | Program | | | | |
| --- | --- | --- | --- | --- | --- | --- | --- |
| CELL | L/R | B | YDA | YDB_EV | YDB_OD | YD_EV/OD | YP |
| 0 | L | 00 | DL,0 | 0 | 0 | EV | 3 |
| 0 | R | 00 | 0,1 | 0 | 0 | EV | 1 |
| 1 | L | 01 | 0,1 | 0 | 0 | OD | 0 |
| 1 | R | 01 | 1,2 | 0 | 0 | OD | 2 |
| 2 | L | 02 | 1,2 | 0 | 0 | EV | 1 |
| 2 | R | 02 | 2,3 | 0 | 0 | EV | 3 |
| J-1 | L | J-1 | K-2,K-1 | 1 | 0 | OD | 2 |
| J-1 | R | J-1 | K-1,0 | 1 | 0 | OD | 0 |
| Z-J | L | Z-J | K-1,0 | J-1 | J-2 | EV | 3 |
| Z-J | R | Z-J | 0,1 | J-1 | J-1 | EV | 1 |
| Z-2 | L | Z-2 | K-3,K-2 | J-1 | J-1 | EV | 1 |
| Z-2 | R | Z-2 | K-2,K-1 | J-1 | J-1 | EV | 3 |
| Z-1 | L | Z-1 | K-2,K-1 | J-1 | J-1 | OD | 2 |
| Z-1 | R | Z-1 | K-1,DR | J-1 | J-1 | OD | 0 |

*FIG. 5B*

| Physical Address | | | Read | | | | |
|---|---|---|---|---|---|---|---|
| CELL | L/R | B | YDA | YDB_EV | YDB_OD | YR | YD_EV/OD |
| 0 | L | 00 | DL,0,1 | 0 | 0 | - | EV |
| 0 | R | 00 | DL,0,1 | 0 | 0 | - | EV |
| 1 | L | 01 | 0,1,2 | 0 | 0 | - | OD |
| 1 | R | 01 | 0,1,2 | 0 | 0 | - | OD |
| 2 | L | 02 | 1,2,3 | 0 | 0 | - | EV |
| 2 | R | 02 | 1,2,3 | 0 | 0 | - | EV |
| --- | --- | --- | --- | --- | --- | - | --- |
| 7 | L | 07 | 6,7,0 | 0,1 | 0 | - | OD |
| 7 | R | 07 | 6,7,0 | 0,1 | 0 | - | OD |
| --- | --- | --- | --- | --- | --- | - | --- |
| 120 | L | 120 | 7,0,1 | 15 | 14,15 | - | EV |
| 120 | R | 120 | 7,0,1 | 15 | 14,15 | - | EV |
| --- | --- | --- | --- | --- | --- | - | --- |
| 126 | L | 126 | 5,6,7 | 15 | 15 | - | EV |
| 126 | R | 126 | 5,6,7 | 15 | 15 | - | EV |
| 127 | L | 127 | 6,7,0 | 15 | 15 | 0 | OD |
| 127 | R | 127 | 6,7,0 | 15 | 15 | 0 | OD |
| R0 | L | R00 | 7,0,1 | - | 15 | 0 | EV |
| R0 | R | R00 | 7,0,1 | - | 15 | 0 | EV |
| R1 | L | R01 | 0,1,2 | - | - | 0 | OD |
| R1 | R | R01 | 0,1,2 | - | - | 0 | OD |
| R2 | L | R02 | 1,2,3 | - | - | 0 | EV |
| R2 | R | R02 | 1,2,3 | - | - | 0 | EV |
| R3 | L | R03 | 2,3,DR | - | - | 0 | OD |
| R3 | R | R03 | 2,3,DR | - | - | 0 | OD |

*FIG. 6A*

| Physical Address | | | Program | | | | | |
|---|---|---|---|---|---|---|---|---|
| CELL | L/R | B | YDA | YDB_EV | YDB_OD | YR | YD_EV/OD | YP |
| 0 | L | 00 | DL,0 | 0 | 0 | - | EV | 3 |
| 0 | R | 00 | 0,1 | 0 | 0 | - | EV | 1 |
| 1 | L | 01 | 0,1 | 0 | 0 | - | OD | 0 |
| 1 | R | 01 | 1,2 | 0 | 0 | - | OD | 2 |
| 2 | L | 02 | 1,2 | 0 | 0 | - | EV | 1 |
| 2 | R | 02 | 2,3 | 0 | 0 | - | EV | 3 |
| --- | --- | --- | --- | --- | --- | - | --- | - |
| 7 | L | 07 | 6,7 | 0 | 0 | - | OD | 2 |
| 7 | R | 07 | 7,0 | 0 | 1 | - | OD | 0 |
| --- | --- | --- | --- | --- | --- | - | --- | - |
| 120 | L | 120 | 7,0 | 15 | 14 | - | EV | 3 |
| 120 | R | 120 | 0,1 | 15 | 15 | - | EV | 1 |
| --- | --- | --- | --- | --- | --- | - | --- | - |
| 126 | L | 126 | 5,6 | 15 | 15 | - | EV | 1 |
| 126 | R | 126 | 6,7 | 15 | 15 | - | EV | 3 |
| 127 | L | 127 | 6,7 | 15 | 15 | - | OD | 2 |
| 127 | R | 127 | 7,0 | - | 15 | - | OD | 0 |
| R0 | L | R00 | 7,0 | - | 15 | 0 | EV | 3 |
| R0 | R | R00 | 0,1 | - | - | 0 | EV | 1 |
| R1 | L | R01 | 0,1 | - | - | 0 | OD | 0 |
| R1 | R | R01 | 1,2 | - | - | 0 | OD | 2 |
| R2 | L | R02 | 1,2 | - | - | 0 | EV | 1 |
| R2 | R | R02 | 2,3 | - | - | 0 | EV | 3 |
| R3 | L | R03 | 2,3 | - | - | 0 | OD | 2 |
| R3 | R | R03 | 3,DR | - | - | 0 | OD | 0 |

*FIG. 6B*

| Physical Address | | | Program | | | | | |
|---|---|---|---|---|---|---|---|---|
| CELL | L/R | B | YDA | YDB_EV | YDB_OD | YR | YD_EV/OD | YP |
| 0 | L | 00 | 0,1 | 0 | 0 | - | EV | 3 |
| 0 | R | 00 | DL,0 | 0 | 0 | - | EV | 1 |
| 1 | L | 01 | 1,2 | 0 | 0 | - | OD | 0 |
| 1 | R | 01 | 0,1 | 0 | 0 | - | OD | 2 |
| 2 | L | 02 | 2,3 | 0 | 0 | - | EV | 1 |
| 2 | R | 02 | 1,2 | 0 | 0 | - | EV | 3 |
| --- | --- | --- | --- | --- | --- | - | --- | - |
| 7 | L | 07 | 7,0 | 0 | 0 | - | OD | 2 |
| 7 | R | 07 | 6,7 | 0 | 1 | - | OD | 0 |
| --- | --- | --- | --- | --- | --- | - | --- | - |
| 120 | L | 120 | 0,1 | 15 | 15 | - | EV | 3 |
| 120 | R | 120 | 7,0 | 15 | 14 | - | EV | 1 |
| --- | --- | --- | --- | --- | --- | - | --- | - |
| 126 | L | 126 | 6,7 | 15 | 15 | - | EV | 1 |
| 126 | R | 126 | 5,6 | 15 | 15 | - | EV | 3 |
| 127 | L | 127 | 7,0 | 15 | 15 | - | OD | 2 |
| 127 | R | 127 | 6,7 | - | 15 | - | OD | 0 |
| R0 | L | R00 | 0,1 | - | 15 | 0 | EV | 3 |
| R0 | R | R00 | 7,0 | - | - | 0 | EV | 1 |
| R1 | L | R01 | 1,2 | - | - | 0 | OD | 0 |
| R1 | R | R01 | 0,1 | - | - | 0 | OD | 2 |
| R2 | L | R02 | 2,3 | - | - | 0 | EV | 1 |
| R2 | R | R02 | 1,2 | - | - | 0 | EV | 3 |
| R3 | L | R03 | 3,DR | - | - | 0 | OD | 2 |
| R3 | R | R03 | 2,3 | - | - | 0 | OD | 0 |

*FIG. 7*

BIT LINE DECODING SCHEME AND CIRCUIT FOR DUAL BIT MEMORY ARRAY

This application claims priority to Provisional Patent Application serial No. 60/303,712, filed on Jul. 6, 2001, which is herein incorporated by reference.

BACKGROUND OF THE INVENTION

1. Field of Invention

This invention applies to semiconductor memories and in particular to a dual bit twin MONOS memory array.

2. Description of Related Art

Both Flash and MONOS EEPROM are comprised of an array of cells that can be independently programmed and read. Select transistors can be added to the array to cut the capacitance on lines, and can be used to enable cells to be erased. Metal Oxide Semiconductor (MOS) field effect transistors are the individual memory units of both types of EEPROMS. The Flash MOS transistor includes a source, drain, and floating gate with a control gate connected to a Word Line (WL). Various voltages are applied to the word line to program the cell with a binary "1", or "0" or to erase the cell.

In the conventional MONOS MOS transistor the programmable component under the control gate is a nitride layer ML and MR as shown in FIG. 1. The twin MONOS memory cell, CELL[X], is comprised of a control gate CG with a left and right component, CG_L and CG_R, under which two separate sites, ML and MR, are used as storage sites in the composite nitride layer. The bit line diffusion, BL, lies under the control gate, CG, and an independent polysilicon word line, WL, lies between the control gates of adjacent cells. Various voltages applied to the control gate CG in combination with bit line BL and word line WL voltages are used to program the left and right cell components with a binary "1" or "0".

The array scheme U.S. Pat. No. 6,011,725 (Eitan) is directed toward a polysilicon word line routed above the control gates of the cells connected to the word line WL. U.S. Pat. No. 6,248,633 (Ogura et al) is directed toward a twin MONOS cell structure having an ultra short control gate channel with ballistic electron injection into the nitride storage sites and fast low voltage programming. U.S. patent application Ser. No. 10/099,030 dated Mar. 15, 2002 is directed toward providing a method of memory cell selection and operation to obtain wide program bandwidth and EEPROM erase capability in a MONOS memory cell. U.S. patent application Ser. No. 09/810,122 dated Mar. 19, 2001 is directed toward an array architecture of nonvolatile memory and its operation methods using a metal bit diffusion array.

In FIG. 1 is shown a cross section of part of an array of twin MONOS memory cells of prior art. Within a twin MONOS cell such as CELL[X] is a control gate CG having a left CG_L and a right CG_R control gate component. Under the left control gate component CG_L lies a left nitride storage site ML, and under the right control gate component CG_R lies a right nitride storage site MR. A bit line diffusion BL lies within the semiconductor substrate and positioned under the control gate CG and between the left and right storage sites, ML and MR. A word line WL running orthogonal to the bit line BL separates adjacent cells.

In FIG. 2 is shown a schematic diagram of prior art of a portion of an array structure formed by the twin MONOS memory cells of FIG. 1. The control gate lines CG[0], CG[1], CG[2] and CG[3] run in parallel with the bit lines BL[0], BL[1], BL[2] and BL[3], and orthogonal to the word lines WL[0] and WL[1]. Shown within the outline of CELL [X] are the left and right control gate components CG_L and CG_R under which are the left and right storage sites ML and MR.

SUMMARY OF THE INVENTION

It is an objective of the present invention to provide a bit line decoding scheme for a twin MONOS memory array.

It is also an objective of the present invention to provide a decoder circuit capable of selecting and controlling bit lines of an array of twin MONOS memory cells to permit reading and programming the twin storage sites of each cell.

It is another objective of the present invention to provide a first decode circuit for even numbered bit lines and a second decode circuit for odd numbered bit lines.

It is still another objective of the present invention to control adjacent bit lines separately from selected bit lines.

It is yet another objective of the present invention to apply a voltage to the bit line used in reading the left and right storage sites of a selected cell and apply a separate voltage to bit lines in adjacent cells.

It is also another objective of the present invention to apply a voltage to the bit line of a selected cell during a program operation and to apply a separate voltage to the bit line to a cell adjacent to the storage site being programmed.

The present invention is essentially a multiplexer for the bit line diffusions of a twin MONOS memory array, where a twin MONOS cell comprises two side by side control gates under which are two nitride storage sites that share a bit line single diffusion. During a read operation a specific voltage is applied to the single bit line diffusion, and a separate voltage is applied to the bit line diffusions of the two adjacent cells. All other diffusions within a sub-block are unselected and floating. The voltage application on the selected bit line diffusion and the two neighboring bit line diffusions for a read operation remain the same whether the control gate being used to read is on the left or the right control gate. However, for a program operation only the bit line diffusion of the selected cell and the bit line diffusion of the neighbor cell closest to the storage site being programmed are selected. If the left storage site under the left control gate of the selected cell is to be programmed, the bit line diffusion in the cell to the left of the cell being programmed is concurrently supplied a separate voltage. If the right storage site under the right control gate of the selected cell is to be programmed, then the bit line diffusion in the cell to the right of the cell being programmed is concurrently supplied a separate voltage. Both these conditions for the program operation are met by a design of a separate MUX for even and odd bit lines. While one bit line is selected by a first MUX for a program operation, the adjacent cells are selected by a second MUX.

If there are X=number of Cells on a word line, then the word line is divided into Y blocks, where Y is the number of sense amplifiers or I/O's, and Z=X/Y where Z the number of cells per block. Depending on the parasitic capacitance, the word line blocks are divided into J sub-blocks, such that the number of cells per sub-block is K=Z/J. If we define z=0:Z−1, then each block y=0:Y−1 contains an array of bit lines BL[y*Z+(z)]. Each sub-block j=0:J−1 of block y, contains an array of bit lines BL[y*Z+j*K+(k)], where k=0:K−1. Assuming that X and Y are even, then it follows that Z, J and K are all even. In addition, there may be a dummy/recursive memory cell at the beginning called REL [y], and RER[y] at the end of each block.

BRIEF DESCRIPTION OF THE DRAWINGS

This invention will be described with reference to the accompanying drawings, wherein:

FIG. 1 is a cross section of a portion of a row of twin MONOS memory cells of prior art, FIG. 2 is a schematic diagram of a portion of an array of twin MONOS memory cells of prior art, FIG. 5A is a table showing the bit line decoder signals for reading storage sites in the schematic diagram of FIG. 3, FIG. 5B is a table showing the bit line decoder signals for programming storage sites in the schematic diagram of FIG. 3, FIG. 6A is a table showing the bit line decoder signals for reading storage sites in the schematic diagram of FIG. 4, and FIG. 6B is a table showing the bit line decoder signals for programming storage sites in the schematic diagram of FIG. 4.

FIG. 7 is a table showing the bit line decoder signals for a second embodiment for programming storage sites of the present invention shown in FIG. 4.

DETAILED DESCRIPTION OF THE PREFERRED EMBODIMENT

Figure 3:
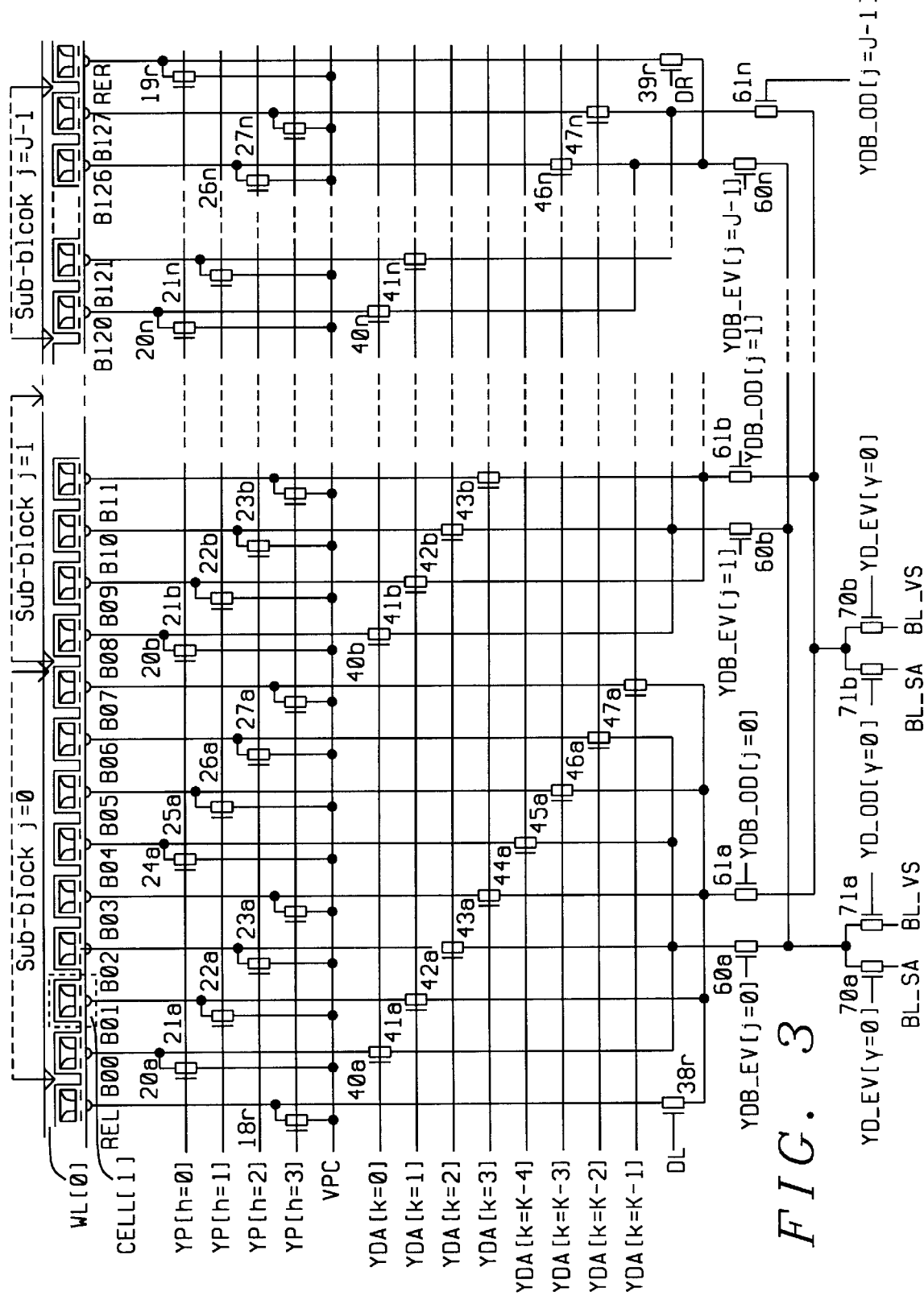
FIG. 3 is a schematic diagram of a bit line decoder of the present invention.

In FIG. 3 is shown a bit line decoder circuit of the present invention connected to a row of twin MONOS memory cells, as represented by CELL[1], that are connected to a word line WL[0]. Each memory cell has two storage sites similar to that shown in FIG. 1. For purposes of the discussion herein the memory cells have the same number representation as the bit lines. At each end of the row of memory cells are dummy cells connected to the bit lines REL and RER. The purpose of these redundant cells is to provide bias support for read and program operations where the adjacent bit line is required to have a bias in order to read or program a storage site in the cells.

A block of cells shown in FIG. 3 are connected to word line WL[0] and bit lines B00, B01, and B02 through B127. The cells and corresponding bit lines are partitioned into "j" sub-blocks and further partitioned into odd and even groups. The first sub-block (j=0) with bit lines connected to selectors 40a through 47a is partitioned into cells with odd and even bit lines. The even bit lines are connected together through selectors 40a, 42a, 44a and 46a in sub-block j=0 and are further connected to an even bit line selector. 60a. The odd bit lines are connected together through selectors 41a, 43a, 45a and 47a in sub-block j=0 and are further connected to an odd bit line selector 61a. A decoder signal YDB_EV[j=0] selects the even bit line selector 60a, and a decoder signal YDB_OD[j=0] selects the odd bit line selector 61a. A bit line bias VPC is connected to bit lines in sub-block j=0 through bias selectors 20a, 21a, 22a, 23a, 24a, 25a, 26a, and 27a.

The second sub-block (j=1) with bit lines connected to selectors 40b through 47b is partitioned into cells with odd and even bit lines. The even bit lines are connected together through selectors 40b, 42b, 44b and 46b in sub-block j=1 and are further connected to an even bit line selector 60b (where 44b and 46b are not shown in FIG. 3). The odd bit lines are connected together through selectors 41b, 43b, 45b and 47b in sub-block j=1 and are further connected to an odd bit line selector 61b (where 45b and 47b are not shown in FIG. 3). A decoder signal YDB_EV[j=1] selects the even bit line selector 60b, and a decoder signal YDB_OD[j=1] selects the odd bit line selector 61b. A bit line bias VPC is connected to bit lines in sub-block j=1 through bias selectors 20b, 21b, 22b, 23b, 24b, 25b, 26b, and 27b (where 24b, 25b, 26b, and 27b are not shown in FIG. 3).

Similarly, each sub-block is partitioned into cells with odd and even bit lines up to and including the last sub-block j=J−1, where J is the total number of sub-blocks. The last sub-block (j=J−1) with bit lines connected to selectors 40n through 47n is partitioned into cells with odd and even bit lines. The even bit lines are connected together through 40n, 42n, 44n and 46n in sub-block j=J−1 and are further connected to an even selector 60n (where 42n and 44n are not shown in FIG. 3). The odd bit lines are connected together through selectors 41n, 43n, 45n and 47n in sub-block j=J−1 and are further connected to an odd selector 61n (where 43n and 45n are not shown, in FIG. 3). A decoder signal YDB_EV[j=J−1] selects the even bit line selector 60n, and a decoder signal YDB_OD[j=J−1] selects the odd bit line selector 61n. A bit line bias VPC is connected to bit lines in sub-block j=1 through bias selectors 20n, 21n, 22n, 23n, 24n, 25n, 26n, and 27n (where 22n, 23n, 24n, and 25n are not shown in FIG. 3).

The bit line selectors of each sub-block are selected by a set of decoder signals YDA. The first set of bit line selector in each sub-block, 40a and 40b through to bit line selector 40n of the last sub-block, is activated by the decoder signal YDA[k=0]. The second set bit line selector, 41a and 41b through to 41n, is activated by decoder signal YDA[k=1]. The last bit line selector in each sub-block, 47a and 47b through to 47n, is activated by the decoder signal YDA[k=K−1], where K is the number of cells in each sub-block. In the example of a bit line decoder in FIG. 3 there are eight cells in a sub-block; therefore K=8, YDA[k=K−4]=YDA[k=4], YDA[k=K−3]=YDA[k=5], YDA[k=K−2]=YDA[k=6] and YDA[k=K−1]=YDA[k=7].

The bias selectors, shown in FIG. 3, are organized such that the bit lines adjacent to any selected bit line can be biased by VPC and by a voltage different from that of the selected bit line. Bias selectors 20a, 24a, 20b and 24b through to 20n and 24n are controlled by bit line decoder signal YP[h=0] (where bias selectors 24b and 24n are not shown in FIG. 3). The symbol "h" represents the number of the decoder bias select signal YP[h] within a biasing sub-sub-group H. For example, bit line B00, B01, B02 and B03 form a biasing sub-sub-group H=0 in sub-block j=0, and B04, B05, B06 and B07 for a biasing sub-sub-group H=1 in sub-block j=0. Bit line B01 of Cell[1] is biased by means of the bias select line YP[h=1]. Bit line B05 is also biased by means of the bias select line YP[h=1], as are B09 and B127. In the diagram of FIG. 3 there are two biasing sub-sub-groups, H=0 and H=1. Additional biasing sub-sub-groups may be used depending upon the design of the decoder array.

Bias selectors 21a, 25a, 21b and 25b through to 21n and 25n are controlled by bit line decoder signal YP[h=1] (where bias selectors 25b and 25n are not shown in FIG. 3). Bias selectors 22a, 26a, 22b and 26b through to 22n and 26n are controlled by bit line decoder signal YP[h=2] (where bias selectors 26b and 22n are not shown in FIG. 3). Bias selectors 23a, 27a, 23b and 27b through to 23n and 27n are controlled by bit line decoder signal YP[h=3] (where bias selectors 27b and 23n are not shown in FIG. 3). Between modes, all the bit lines may be charged to a precharge voltage VPC through the bias selectors represented by 20a, 21a, 22a, 23a, 24a, 25a, 26a and 27a. In fact, all bit lines may be charged through the VPC line for block erase with VPC set at the appropriate voltage.

If the bit line B01 connected to CELL[1] of sub-block j=0 is the selected bit line, then bias selector 21a is controlled off by decoder signal YP[h=1] and either or both bit lines B00 and B02 can be connected to the voltage VPC by bias selector 20a controlled by decoder signal YP[h=0] and bias selector 22a controlled by decoder signal YP[h=2]. For a read operation both bit lines B00 and B02 adjacent to the selected bit line B01 may be connected to the voltage VPC through bias selectors 20a and 22a regardless of which of the two storage sites in CELL[1] are being read. If the neighbor bit line voltage conditions require a voltage different from VPC, the bit lines B00 and B02 adjacent to the selected bit line B01 may be connected to a separate voltage source BL__VS. For a program operation, if the left storage site of CELL[1] is being programmed, then the bit line B00 of the left adjacent cell is connected to the voltage VPC through bias selector 20a, and bias selector 22a is not activated. The opposite adjacent bit line on the right, B02, may be connected (and not floated) to the bit line voltage source BL__VS through the YD* decode path if this voltage condition is required. If the right storage site of CELL[1] is being programmed, then the bit line B02 of the right adjacent cell is connected to the voltage VPC through bias selector 22a, and bias selector 20a is not activated. The opposite adjacent cell on the left B00 may be connected (and not floated) to the BL__VS voltage source through the YD* decode path if voltage conditions require so.

At the left end of the block of cells shown in FIG. 3 is a dummy/recursive memory cell REL that is needed to provide adjacent bit line biasing to the cell connected to bit line B00 such that the cell connected to B00 can be read and programmed. A bias selector 18r connects the voltage VPC to the bit line REL under the control of the decoder signal YP[h=3]. A bit line selector 38r connects bit line REL to the odd bit line selector 61a. At the right end of the block of cells is a dummy/recursive memory cell RER that is needed to provide adjacent bit line biasing to the cell connected to bit line B127 such that the cell connected to B127 can be read and programmed. A bias selector 19r connects the voltage VPC to the bit line RER under the control of the decoder signal YP[h=0]. A bit line selector 39r connects bit line REL to the even bit line, selector 60n. The bias selectors 38r and 39r for RER and REL allow for biasing of adjacent bit lines at a voltage different from VPC. In a read operation when, for example, if the left storage site of CELL[0] is target, and B00 is selected while REL is connected to a voltage BL__VS.

The even bit line selectors 60a and 60b through to 60n are connected to sense amplifier through sense amplifier selectors 70a and 71a under the control of decoder signals YD__EV[y=0] and YD__OD[y=0]. The odd bit line selectors 61a and 61b through to 61n are connected to sense amplifier through sense amplifier selectors 70b and 71b under the control of decoder signals YD__EV[y=0] and YD__OD[y=0].

The YDB__EV[j] and YDB__OD[j] decoder signals select which sub block "j" is to be connected to the sense amplifier line BL__SA and neighbor voltage BL__VS. The YD__EV[y] and YD__OD[y] switches the decoded even and odd bit lines between the sense amplifier line BL__SA and neighbor voltage BL__VS. For example if the selected bit line is odd BL01, then YD__OD[j] is selected so the sense amplifier selectors 70b passes the selected odd bit line to BL__SA and while selector 71b connects the adjacent even bit lines B00 and B02 to a separate voltage source BL__VS.

Figure 4:
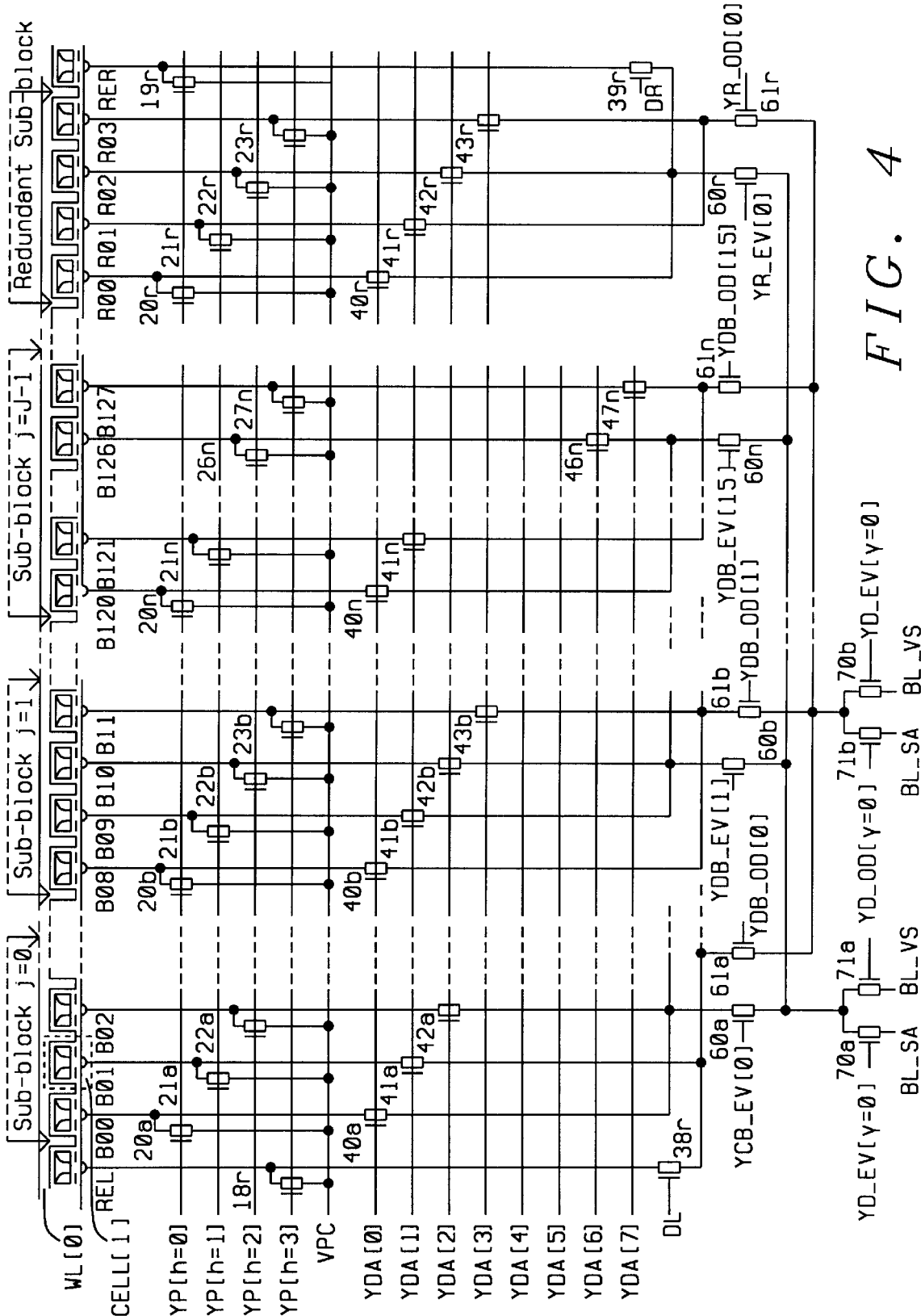
FIG. 4 is a schematic diagram of the bit line decoder of the present invention including redundant cells.

In FIG. 4 is shown the same twin MONOS memory array as shown in FIG. 3 with the addition of spare redundant cells in a redundant sub-block which are connected to bit lines R00, R01, R02, and R03. Each redundant cell bit line is connected to a voltage VPC through bias selectors 20r, 21r, 22r and 23r. The redundant cell bit lines are selected by bit line selectors 40r, 41r, 42r and 43r. The even bit line selectors 40r and 42r of the redundant sub-block are connected to an even bit line selector 60r, which is controlled by a decoder signal YR__EV[0]. The odd bit line selectors 41r and 43r of the redundant block are connected to an odd bit line selector 61r, which is controlled by a decoder signal YR__OD[0]. The even redundant bit line selector 60r is connected to sense amplifier selectors 70a and 71a, and the odd redundant bit line selector 61r is connected to sense amplifier selectors 70b and 71b. The right most dummy cell connected to bit line RER is adjacent to the redundant cell connected to bit line R03 and provides a means by which adjacent cell bias can be created for read and program operations for the redundant cell connected to bit line R03.

The following procedure with reference to FIG. 3 is used for a read operation on a selected cell in block y and sub-block j:

Choosing a bit line B
   YDA[k] is turned ON (the selected bit line)
   YDB__EV[j] is turned ON
   YDB__OD[j] is turned ON
Choosing neighboring bit lines
   If k=0, (first cell in sub-block)
     If j!=0 where "!" means NOT
       YDA[k+1] is turned ON (right adjacent bit line)
       YDA[k-1] is turned ON (left adjacent bit line)
       YDB__OD[j-1] is turned ON
     If j=0
       YDA[k+1} is turned ON (right adjacent bit line)
       DL is turned ON (left adjacent bit line)
   If k=K-1, (last cell in sub-block)
     If j!=J-1
       YDA[k-1] is turned ON (left adjacent bit line)
       YDA[0] is turned ON (right adjacent bit line)
       YDB__EV[j+1] is turned ON
     If j=J-1
       YDA[k-1] is turned ON (left adjacent bit line)
       DR is turned ON (right adjacent bit line)
   Otherwise, if k!=0 and if k!=K-1 (neither first nor last cell in sub-block)
     YDA[k-1] is turned ON (left adjacent bit line)
     YDA[k+1] is turned ON (right adjacent bit line)
Choosing the output signal
   If k is EVEN,
     YD__EV[y] is turned ON
   If k is ODD,
     YD__OD[y] is turned ON The following procedure with reference to FIG. 3 is used for a program operation on a selected cell in block y and sub-block j.

Choosing bit line B
   YDA[k] is turned ON (selected bit line)
   YDB__EV[j] is turned ON
   YDB__OD[j] is turned ON
Choosing neighboring bit lines
   If k=0, (first cell in sub-block) AND If the selected CG is LEFT
     If j!=0 (not the first sub-block)
       YDA[K-1] is turned ON
       YDB__OD[-1] is turned ON If j=0 (the first sub-block)
    DL is turned ON
If k=K−1, (last cell in sub block) AND If the selected CG is RIGHT
    If j=!J−1 (not the last sub-block)
        YDA[0] is turned ON
        YDB_EV[j+1] is turned ON
    If j=J−1 (the last sub-block)
        DR is turned ON
If k!=0 or k!=K−1
    If the selected CG is LEFT
        YDA[k−1) is turned ON
    Else if the selected CG is RIGHT
        YDA[k+1] is turned ON
Choosing the input signal
    If k is EVEN,
        YD_EV[y] is turned ON
    If k is ODD,
        YD_OD[y] is turned ON
Choosing the precharge signal for the adjacent bit line
    If the selected control gate (CG) is LEFT
        If h of memory cell to be program is not equal to 0
            YP[h−1) is turned ON
        ELSE
            YP[3] is turned ON
    If the selected CG is RIGHT
        If h of the memory cell to be programmed is not equal to H−1
            YP[h+1] is turned ON
        ELSE YP[0] is turned ON FIG. 5A shows a table containing the required decoder signals to read a left "L" or right "R" storage site of a memory cell shown in FIG. 3. For the left storage site of cell 0 connected to bit line B00, YDA decoder signals DL, k=0 and k=1 are used. Bit line B00 is selected with the YDA (k=0) decoder signal and the adjacent bit lines are selected with decoder signals DL and YDA(k=1). For the right storage site of bit line B00 the same decoder signals are used as are used with the left storage site. When the selected cell for a read operation is the last cell in a sub-block, noted in FIG. 5A as J−1 for sub-block j=0, then the selected cell requires decoder signal YDA[K−1], the left adjacent bit line is in sub-block j=0 requiring decoder signal YDA[K−2] and the right adjacent bit line is in sub-block j=1 requiring decoder signal YDA[0].

When the selected cell "Z−K" (the first cell in sub-block J−1 containing Z−K) is to be read, the selected bit line is "Z−K", where Z is the number of cells in a block and K is the number of cells per sub-block, the required decoder signals are YDA[k=0] for the selected bit line, and YDA[K−1] and YDA[k=1] for the adjacent bit lines. Since the selected cell is the first in the sub-block, the cell and bit line designation is even, which requires the even bit line selector signal YDB_EV[J−1] to be activated along with the odd bit line selector signals YDB_OD[J−1] and YDB_OD[J−2] for the adjacent bit lines, where J−1 and J−2 are address designations of the sub-block decoder signals for the even and odd bit line selectors.

Continuing to refer to FIG. 5A, when the selected cell "Z−1" (the last cell in the last sub-block) is to be read, the selected bit line is "Z−1", the required decoder signals are YDA[K−1] for the selected bit line, and YDA[K−2] and DR for the adjacent bit lines. The odd bit line selector signal YDB_OD[J−1] is required to be activated to select bit line B127 of the selected cell to be connected to the odd sense amplifier path, and the even bit line selector signal YDB_EV[J−1] is required to select the even adjacent bit lines to be connected the even neighbor path to BL_VS.

FIG. 5B shows a table of the decoder signals needed to program the various cells shown in FIG. 3. For a program operation on a twin MONOS memory cell only the bit line adjacent to the side of the selected memory cell next to the storage site to be programmed needs to be biased in the first embodiment of the present invention. Thus, if the left storage site is to be programmed, the bit line of the selected cell and the left adjacent bit line are selected. If the left storage site of CELL[0] is selected, then bit line B00 is selected by the decoder signal YDA[k=0] and the left adjacent bit line REL for the dummy cell is selected by the decoder signal DL. Both the even and odd selectors are selected by decoder signals YDB_EV[0] and YDB_OD[0], which allows the selected bit line and the left adjacent bit line to be appropriately biased to perform the program operation. The left adjacent bit line is pre-charged by the decoder signal YP[3] selecting VPC to be connected to the left adjacent bit line.

If the right storage site for CELL[0] is to be programmed a decoder signal YDA[k=0] is activated to select the bit line of the cell to be programmed and decoder signal YDA[k=1] is activated to select the right adjacent bit line. The even bit line selector 60a is selected by decoder signal YDB_EV[0] to allow the bit line of the selected cell to be connected to the even sense amplifiers through the sense amplifier selector 70a. The odd bit line selector is selected by the decoder signal YDB_OD[0] to allow the right adjacent bit line to be connected to voltage source BL_VS through the sense amplifier selector 71a. The right adjacent bit line is precharged by the decoder signal YP[1] selecting VPC to be connected to the right adjacent bit line.

Continuing to refer to FIG. 5B, if the cell to be programmed is the last cell in a sub-block such as cell "J−1", then the selected bit line (J−1) is selected by decoder signal YDA[K−1] in FIG. 3. To program the left storage site, the left adjacent bit line "J−2" is selected by decoder signal YDA[K−2], and to program the right storage site the right adjacent bit line "J" is selected by the decoder signal YDA[0]. Since the selected cell is the last cell in a sub-block, the odd and even bit line selectors used for the right storage site are for different sub-blocks (YDB_OD[0] decoder signal for the selected bit line and YDDB_EV[1] for the right adjacent bit line).

If the cell to be programmed is the first cell in a sub-block (represented by CELL[Z−J] in FIG. 5B), which is not in the first sub-block, then the selected bit line is "Z−J", which is selected by the decoder signal YDA[0]. To program the left storage site, the left adjacent bit line is selected by decoder signal YDA[k=K−1], and to program the right storage site the right adjacent bit line is selected by decoder signal YDA[k=1]. Since the first cell in a sub-block is even, the left adjacent bit line is odd which uses the odd bit line selector selected by decoder signal YDB_OD[J−2] of the left adjacent sub-block. The odd bit line selector for the right adjacent bit line is selected by decoder signal YDB_OD[J−1] and the selected even bit line Z−J is selected to be connected to the sense amplifiers by the decoder signal YDB_EV[J−1].

The last cell Z−1 shown in FIG. 3 requires that the dummy cell connected to bit line RER be used in programming the right storage site for the right adjacent bit line as shown in FIG. 5B. Decoder signal YDA[k=K−1] selects the bit line Z−1=B127 of the selected cell and decoder signal DR select the right adjacent bit line RER connected to a redundant cell.

The odd and even bit line selectors are YDB_OD[J−1] for the bit line connected to the selected cell and YDB_EV[J−1] for the bit line connected to the redundant cell RER.

FIGS. 6A and 6B show tables of the decoder signals necessary to read and program MONOS memory cells using the designations of the bit lines and signals of FIG. 4. The numbering scheme is as explicitly shown in FIG. 4, but otherwise the operations and signals are the same as in FIGS. 5A and 5B exclusive of the addition of redundant cells R0, R1, R2 and R3. In the example shown in FIG. 4 and tabulated in FIGS. 6A and 6B the right dummy cell connected to bit line RER is to the right of the redundant cells and is used in the read and program operations of redundant cell R3 connected to bit line R03. In order to read the last redundant cell CELL[R3], bit line R03 is selected by decoder signal YDA[3] and the left and right bit lines are selected by decoder signals YDA[2] and DR. To program the left storage site of CELL[R3], bit line R02 is pre-charged by selecting bias selector YP[2] and then selecting the left adjacent bit line R2 by decoder signal YDA[2]. The right storage site of redundant cell CELL[R3] is programmed by selecting bit line R03 with decoder signal YDA[3], pre-charging the right adjacent bit line by selecting decoder signal YP[0] and then selecting the right adjacent bit line with decoder signal DR.

The redundant cells R0, R1, R2 and R3 are programmed and read using the same methodology used for the regular cells numbered from 0 to 127 with the exception that the odd/even redundant bit line selectors 60r and 61r with decoder signals YR_EV[0] and YR_OD[0] are unique to the redundant cells, which connect the selected bit lines to the appropriate sense amplifier selectors used by the rest of the decoders system.

In a second EMBODIMENT of the present invention, the following procedure with reference to FIG. 3 is used for a program operation on a selected cell in block y and sub-block j.

Choosing bit line B
    YDA[k] is turned ON (selected bit line)
    YDB_EV[j] is turned ON
    YDB_OD[j] is turned ON
Choosing opposite neighboring bit lines
    If k=0, (first cell in sub-block) AND If the selected CG is RIGHT
        If j!=0 (not the first sub-block)
            YDA[K−1] is turned ON
            YDB_OD[j−1] is turned ON
        If j=0 (the first sub-block)
            DL is turned ON
    If k=K−1, (last cell in sub block) AND If the selected CG is LEFT
        If j=!J−1 (not the last sub-block)
            YDA[0] is turned ON
            YDB_EV[j+1] is turned ON
        If j=J−1 (the last sub-block)
            DR is turned ON
    If k!=0 or k!=K−1
        If the selected CG is LEFT
            YDA[k+1) is turned ON
        Else if the selected CG is RIGHT
            YDA[k−1] is turned ON
Choosing the input signal
    If k is EVEN,
        YD_EV[y] is turned ON
    If k is ODD,
        YD_OD[y] is turned ON Choosing the precharge signal for the adjacent bit line
    If the selected control gate (CG) is LEFT
        If h of memory cell to be program is not equal to 0
            YP[h−1) is turned ON
        ELSE
            YP[3] is turned ON
    If the selected CG is RIGHT
        If h of the memory cell to be programmed is not equal to H−1
            YP[h+1] is turned ON
        ELSE YP[0] is turned ON FIG. 7 shows a table of the second embodiment of the bit line decoder signals for. programming the various cells of a twin MONOS array shown in FIG. 4. In the first embodiment only the bit line adjacent to the side of the selected memory cell next to the selected storage site to be programmed needs to be biased. It is possible for the immediately adjacent bit line to be charged to either VPC or selectively to a separate voltage BL_VS. Likewise, the oppositely adjacent bit line (on the opposite side of the selected memory cell storage site to be programmed) may be charged to either VPC or selectively to BL_VS or floating unselected. In the second embodiment, the immediately adjacent bit line is charged to VPC and the opposite adjacent bit line is connected to BL_VS.

In the first embodiment, if the left storage site is to be programmed, the bit line of the selected cell and the left adjacent bit line are to be selected. Precharge of bit lines may be selective or done by connecting all bit lines to VPC before both read or program. In the second embodiment, if the left storage site is to be programmed, the bit line of the selected cell and the right adjacent bit line are selected. The bit line of the selected cell is biased to a high positive voltage and the right adjacent bit line is biased with a moderate positive voltage to provide a program inhibit. The left adjacent bit line is connected to a low voltage using the bias selector connected to the left adjacent bit line.

Continuing to refer to FIG. 7, if the left storage site of CELL[0] is selected, then bit line B00 is selected by the decoder signal YDA[k=0]. The right adjacent bit line B01 (on the opposite side of the selected memory cell from the storage site) is selected through decoder signal YDA[k=1], and bias selector YP[3] is selected to provide a low bias to the left adjacent bit line REL. Both the even and odd selectors are selected by decoder signals YDB_EV[0] and YDB_OD[0], which allows the selected bit line to be biased with a high positive voltage, and the right adjacent bit line to be biased with a moderate voltage for program inhibit The left adjacent bit line is connected by the decoder signal YP[3] selecting VPC to be connected to the left adjacent bit line.

If the right storage site for CELL[0] is to be programmed a decoder signal YDA[k=0] is activated to select the bit line of the cell to be programmed, and the left oppositely adjacent bit line REL for the dummy cell is selected by the decoder signal DL. The even bit line selector 60a is selected by decoder signal YDB_EV[0] to allow the bit line of the selected cell to be connected to the even sense amplifiers through the sense amplifier selector 70a. The odd bit line selector is selected by the decoder signal YDB_OD[0] to allow the left adjacent bit line to be connected to voltage source BL_VS through the sense amplifier selector 71a. The right adjacent bit line is selected by the decoder signal YP[1] selecting VPC to be connected to the right adjacent bit line.

Continuing to refer to FIG. 7, if the cell to be programmed is the last cell in a sub-block, for example "CELL 7", then the selected bit line is B07 which is selected by decoder signal YDA[7] in FIG. 4. To program the left storage site, the left adjacent bit line B06 is connected to VPC through signal YP[2], while the right adjacent bit line B08 is selected by decoder signal YDA[k=0]. Since the selected cell is the last cell in a sub-block, the odd and even bit line selectors used for the left storage site are for different sub-blocks (YDB_OD[0] decoder signal for the selected bit line and YDB_EV[1] for the right adjacent bit line). To program the right storage site, the right adjacent bit line B08 is connected to VPC through signal YP[0] while the left adjacent bit line B06 is selected by the decoder signal YDA[6].

If the cell to be programmed is the first cell in a sub-block (represented by CELL[120] in FIG. 7), which is not in the first sub-block, then the selected bit line is B120, which is selected by the decoder signal YDA[0]. To program the left storage site, the right adjacent bit line B121 is selected by YDA[1] and the left adjacent bit line is biased by use of decoder signal YP[3]. To program the right storage site, the left adjacent bit line is selected by YDA[7] and the right adjacent bit line is biased by use of the decoder signal YP[1]. Since the first cell in a sub-block is even, the left oppositely adjacent bit line is odd which uses the odd bit line selector selected by decoder signal YDB_OD[j] of the left adjacent sub-block (j=14). The odd bit line selector for the right oppositely adjacent bit line is selected by decoder signal YDB_OD[15] and the selected even bit line 120 is selected to be connected to the sense amplifiers by the decoder signal YDB_EV[15].

The last cell CELL R3 shown in FIG. 4 requires that the dummy cell connected to bit line RER be used in programming the right storage site for the right adjacent bit line as shown in FIG. 7. Decoder signal YDA[3] selects the bit line R03 of the selected cell and decoder signal DR selects the right adjacent bit line RER connected to a redundant cell. The odd and even bit line selectors are YR_OD[0] for the bit line connected to the selected cell and YR_EV[0] for the bit line connected to the redundant cell RER.

While the invention has been particularly shown and described with reference to preferred embodiments thereof, it will be understood by those skilled in the art that various changes in form and details may be made without departing from the spirit and scope of the invention.

What is claimed is:

1. A bit line decoder for a twin MONOS memory cell array, comprising:
    a) a bit line decoder connected to bit lines of a twin MONOS memory cell array containing a left and a right storage site,
    b) said bit line decoder organized by even and odd bit line addresses and further organized by memory sub-block and connected to said bit lines of the memory array,
    c) said bit line decoder selects the bit line connected to a selected memory cell and selects the bit lines connected to memory cells that are adjacent to said selected memory cell to provide bias in support for the selected memory cell for read and program operations.

2. The bit line decoder of claim 1, wherein said bit line decoder selects bit lines connected to cells that are left adjacent and right adjacent to the selected memory cell for a read operation.

3. The bit line decoder of claim 1, wherein said bit line decoder selects bit lines connected to cells that are adjacent to the storage site of the selected memory cell for al program operation.

4. The bit line decoder of claim 3 wherein said bit line decoder selects said bit line connected to a left adjacent cell when said left storage site is to be programmed.

5. The bit line decoder of claim 3, wherein said bit line decoder selects said bit line connected to a right adjacent cell when said right storage site is to be programmed.

6. The bit line decoder of claim 1 further comprising:
    a) a first bit line decoder portion connected to said bit lines with even addresses; in a plurality of sub-blocks,
    b) a second bit line decoder portion connected to said bit lines with odd addresses in a plurality of sub-blocks,
    c) a third bit line decoder portion connected to said bit lines in a plurality of sub-divided sub-blocks,
    d) a fourth bit line decoder portion connected to said bit lines selected by said first bit line decoder,
    e) a fifth bit line decoder portion connected to said bit lines selected by said second bit line decoder,
    f) a sixth bit line decoder portion connecting memory I/O and memory sense amplifiers to bit lines selected by said fourth decoder portion,
    g) a seventh bit line decoder portion connecting memory I/O and memory sense amplifiers to bit lines selected by said fifth decoder portion.

7. The bit line decoder of claim 6, wherein said third bit line decoder portion connects a voltage bias to said bit lines in said subdivided sub-blocks.

8. The bit line decoder of claim 6, wherein said fourth bit line decoder portion selects even addressed bit lines selected by said first bit line decoder portion from said plurality of sub-blocks.

9. The bit line decoder of claim 6, wherein said fifth bit line decoder portion selects odd addressed bit lines selected by said second bit line decoder portion from said plurality of sub-blocks.

10. A method for selecting bit lines to read storage sites of a twin MONOS memory array, comprising:
    a) selecting a bit line to be read,
    b) selecting a right adjacent bit line to said bit line to be read,
    c) selecting a left adjacent bit line to said bit line to be read,
    d) activating an even address bit line selector,
    e) activating an odd address bit line selector,
    f) connecting said selected bit line to memory I/O,
    g) connecting said selected right adjacent bit line and said left adjacent bit line to a voltage.

11. The method of claim 10, wherein said selected bit line has an even address and is connected to memory I/O through said even address bit line selector, and said right and left adjacent bit lines have an odd address and are connected to said voltage through said odd address bit line selector.

12. The method of claim 10, wherein said selected bit line has an odd address and is connected to memory I/O through said odd address bit line selector, and said right and left adjacent bit lines have an even address and are connected to said voltage through said even address bit line selector.

13. The method of claim 10, wherein said selected bit line of the memory cell to be programmed has an even address and is connected to said sense amplifiers through, an even address bit line selector, and said adjacent bit line has an odd address and is connected to said voltage through an odd address bit line selector.

14. The method of claim 10, wherein said selected bit line of the memory cell to be programmed has an odd address and is connected to said sense amplifiers through an odd address bit line selector, and said adjacent bit line has an even address and is connected to said voltage through an even address bit line selector.

15. A decoder method for selecting bit lines to read storage sites of a twin MONOS memory array, comprising:
   a) partitioning a block of a twin MONOS memory array into a plurality of sub-blocks,
   b) partitioning a plurality of bit lines within said sub-blocks into a first partition and a second partition,
   c) selecting a first bit line to be read from said plurality of bit lines in said first partition,
   d) selecting a second bit line left adjacent to said first bit line from said second partition,
   e) selecting a third bit line right adjacent to said first bit line from said second partition,
   f) connecting said first bit line to an I/O of said memory array,
   g) connecting said second and said third bit lines to a voltage.

16. The decoder method of claim 15, wherein said first bit line is an even addressed bit line contained within said first partition of even addressed bit lines and said second and third bit lines are odd addressed bit lines contained within said second partition of odd addressed bit lines.

17. The decoder method of claim 15, wherein said first bit line is an odd addressed bit line contained within said first partition of odd addressed bit lines and said second and third bit lines are even addressed bit lines contained within said second partition of even addressed bit lines.

18. The decoder method of claim 15, wherein said first bit line is a lowest address within said first partition of a first sub-block thereby requiring selection of said second bit line from a highest address in a third partition which is left adjacent to said first partition and located in a second sub-block which is left adjacent to said first sub-block.

19. The decoder method of claim 15, wherein said first bit line is a highest address within said first partition of a first sub-block thereby requiring selection of said third bit line from a lowest address in a third partition which is right adjacent to said first partition and located in a second sub-block which is right adjacent to said first sub-block.

20. A method of selecting bit lines to perform a program operation on storage sites of a twin MONOS memory array, comprising:
   a) selecting a bit line of a memory cell to be programmed which contains a left and a right storage site,
   b) selecting said storage site to be programmed,
   c) selecting a bit line adjacent to the storage site to be programmed,
   d) activating an even address bit line selector,
   e) activating an odd address bit line selector,
   f) connecting said bit line of the memory cell to be programmed to a sense amplifier,
   g) connecting to a voltage to said bit line adjacent to said storage site to be programmed.

21. The method of claim 20, wherein said storage site selected to be programmed is said left storage site and said adjacent bit line is a left adjacent bit line to said bit line of the memory cell to be programmed.

22. The method of claim 20, wherein said storage site selected to be programmed is said right storage site and said adjacent bit line is a right adjacent bit line to said bit line of the memory cell to be programmed.

23. A decoder method for selecting bit lines for programming storage sites of a twin MONOS memory array, comprising:
   a) partitioning a block of a twin MONOS memory cells into a plurality of sub-blocks, each cell containing a left and a right storage site b) partitioning a plurality of memory cells within said sub-blocks into a first partition and a second partition,
   c) selecting said storage site to be programmed of a first memory cell,
   d) selecting a first bit line connected to said first memory cell,
   e) selecting a second bit line connected to a second memory cell adjacent to a location of said storage site in said first memory cell,
   f) connecting first bit line to a sense amplifier,
   g) connecting said second bit line to a voltage.

24. The decoder method of claim 23, wherein said first bit line is an even addressed bit line contained within said first partition of even addressed bit lines and said second line is an odd addressed bit line contained within said second partition of odd addressed bit lines.

25. The decoder method of claim 23, wherein said first bit line is an odd addressed bit line contained within said first partition of odd addressed bit lines and said second bit line is an even addressed bit line contained within said second partition of even addressed bit lines.

26. The decoder method of claim 23, wherein said first memory cell is a lowest address within said first partition of a first sub-block and a left storage site is selected to be programmed, thereby requiring selection of said second bit line in a third memory cell with a highest address in a third partition which is left adjacent to said first partition and located in a second sub-block which is left adjacent to said first sub-block.

27. The decoder method of claim 23, wherein said first memory cell is a highest address within said first partition of a first sub-block and a right storage site is selected to be programmed, thereby requiring selection of said second bit line in a third memory cell with a lowest address in a third partition which is right adjacent to said first partition and located in a second sub-block which is right adjacent to said first sub-block.

28. A decoder means for selecting bit lines of a twin MONOS memory array to enable a read operation, comprising:
   a) a means for selecting a first bit line connected to a first memory cell containing left and right storage sites,
   b) a means for selecting a second bit line connected to a second memory cell that is left adjacent to said first memory cell,
   c) a means for selecting a third bit line connected to a third memory cell that is right adjacent to said first memory cell,
   d) a means for connecting said first bit line to memory I/O,
   e) a means for connecting said second and third bit lines to a voltage.

29. The decoder means of claim 28, wherein the means for selecting said first bit line selects an even addressed bit line, thereby said second and third bit lines are odd addressed bit lines.

30. The decoder means of claim 28, wherein the means for selecting said first bit line selects an odd addressed bit line, thereby said second and third bit lines are even addressed bit lines.

31. A decoder means for selecting bit lines of a twin MONOS memory array to enable a program operation, comprising:
   a) a means for selecting a first bit line connected to a first memory cell containing two storage sites,
   b) a means for selecting one storage site of said two storage sites, c) a means for selecting a second bit line connected to a second memory cell that is adjacent to a location of said selected one storage site in said first memory cell, d) a means for connecting said first bit line to a memory sense amplifier, e) a means for connecting said second line to a voltage.

32. The decoder means of claim 31, wherein the means for selecting one storage site of said two storage sites is a left located storage site in said first memory cell having an even address, then said second bit line is connected to said second memory cell having an odd address and located adjacent left of said first memory cell.

33. The decoder means of claim 31, wherein the means for selecting one storage site of said two storage sites is a right located storage site in said first memory cell having an even address, then said second bit line is connected to said second memory cell having an odd address and located adjacent right of said first memory cell.

34. The decoder means of claim 31, wherein the means for selecting one storage site of said two storage sites is a left located storage site in said first memory cell having an odd address, then said second bit line is connected to said second memory cell having an even address and located adjacent left of said first memory cell.

35. The decoder means of claim 31, wherein the means for selecting one storage site of said two storage sites is a right located storage site in said first memory cell having an odd address, then said second bit line is connected to said second memory cell having an even address and located adjacent right of said first memory cell.

* * * * *